United States Patent
Moench

(10) Patent No.: US 8,264,284 B2
(45) Date of Patent: Sep. 11, 2012

(54) ATOMIC FREQUENCY ACQUISITION DEVICE BASED ON SELF-MIXING INTERFERENCE

(75) Inventor: Holger Moench, Vaals (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 18 days.

(21) Appl. No.: 12/993,877

(22) PCT Filed: May 27, 2009

(86) PCT No.: PCT/IB2009/052227
§ 371 (c)(1), (2), (4) Date: Nov. 22, 2010

(87) PCT Pub. No.: WO2009/147583
PCT Pub. Date: Dec. 10, 2009

(65) Prior Publication Data
US 2011/0075692 A1    Mar. 31, 2011

(30) Foreign Application Priority Data
Jun. 5, 2008 (EP) ...................... 08104265

(51) Int. Cl.
H03L 7/26 (2006.01)
H01S 1/06 (2006.01)
H01S 3/13 (2006.01)
H01S 3/22 (2006.01)
H03B 17/00 (2006.01)
H03B 21/01 (2006.01)

(52) U.S. Cl. .......... 331/3; 331/37; 331/41; 331/42; 331/94.1; 372/26; 372/29.01; 372/29.011; 372/29.02; 372/32

(58) Field of Classification Search .......... 331/3, 37–42, 331/94.1; 372/26, 29.01, 29.011–29.015, 372/29.02, 32, 69–74
See application file for complete search history.

(56) References Cited

U.S. PATENT DOCUMENTS
5,136,261 A * 8/1992 Lewis .................. 331/94.1
(Continued)

FOREIGN PATENT DOCUMENTS
EP      0899836 A1    3/1999
(Continued)

OTHER PUBLICATIONS
Serkland et al: "VCSELs for Atomic Clocks"; Proceedings of SPIE, 2006, vol. 6132, pp. 6132308-1-613208-11.
(Continued)

Primary Examiner — Levi Gannon
(74) Attorney, Agent, or Firm — Mark L. Beloborodov

(57) ABSTRACT

The present invention relates to an atomic frequency acquisition device comprising a gas cell (400) filled with an atomic gas, a laser light source (100) emitting a laser beam which enters the gas cell (40) and excites a first energy transition of the atomic gas, a local oscillator (700) for generating an oscillator frequency in a frequency range including a frequency of a HFS transition of the atomic gas, and a modulator (600) modulating the laser light source (100) so as to emit laser radiation modulated with the oscillator frequency. An optical reflector (500) is arranged behind the gas cell (400) to reflect the laser beam after passage through the atomic gas so as to re-enter the laser cavity. A photodetector (200) detects beat frequencies caused by self-mixing interference within the laser cavity. A control unit (750, 800) controls the local oscillator (700) so as to periodically vary the oscillation frequency between two frequency margins which are adapted in such a way that a maximum beat frequency in the output signal of the photodetector (200) is within the two frequencies margins. The proposed device allows miniaturization and cost reduction by using a VCSEL with an integrated photodiode and achieves operation with fewer detection problems.

14 Claims, 2 Drawing Sheets

U.S. PATENT DOCUMENTS

| | | |
|---|---|---|
| 6,570,459 B1 | 5/2003 | Nathanson et al. |
| 6,900,702 B2 | 5/2005 | Youngner et al. |
| 7,215,213 B2 | 5/2007 | Mescher et al. |
| 7,239,135 B2 | 7/2007 | Abbink et al. |
| 7,701,302 B2 * | 4/2010 | Koyama ................ 331/94.1 |
| 2006/0022761 A1 * | 2/2006 | Abeles et al. ............ 331/94.1 |
| 2007/0139128 A1 | 6/2007 | Koyama |
| 2007/0146085 A1 | 6/2007 | Koyama |

FOREIGN PATENT DOCUMENTS

| | | |
|---|---|---|
| WO | 2005081794 A2 | 9/2005 |

OTHER PUBLICATIONS

Giuliani et al: "Laser Diode Self-Mixing Technique for Sensing Applications"; Journal of A: Pure and Applied Optics, 2002, vol. 4, No. 6, pp. S283-S294.

* cited by examiner

ATOMIC FREQUENCY ACQUISITION DEVICE BASED ON SELF-MIXING INTERFERENCE

FIELD OF THE INVENTION

The present invention relates to an atomic frequency acquisition device at least comprising a gas cell filled with an atomic gas with first and second energy transitions allowing coherent population trapping, and a laser light source with a laser cavity emitting a laser beam which enters the gas cell and excites the first energy transition of the atomic gas.

Atomic frequency acquisition devices are commonly used as atomic clocks providing a time reference for many applications. With the continuing miniaturization of electronic devices, there is also a need for miniaturized atomic clocks allowing, for example, high-accuracy timing in portable battery-powered devices such as GPS receivers.

BACKGROUND OF THE INVENTION

Coherent population trapping is one of the techniques used in atomic clocks in order to acquire an atomic frequency as a stable time base. Such atomic frequency acquisition devices or atomic clocks comprise a miniaturized gas cell containing a metallic vapor such as, for example, Cs or Rb. Normally, this gas cell is kept at a temperature of about 100° C. so as to realize a certain gas pressure. A laser emitting at a wavelength which fits an optical transition in the corresponding atom, for example, 852 nm for Cs, is arranged to direct the laser beam into the gas cell filled with the corresponding atomic gas. At the same time, the laser emission is modulated by a stable electronic oscillator running at a frequency which fits half the hyperfine transition of the corresponding atom, e.g. 4.6 GHz for half the Cs splitting. This frequency is used as the time base for the atomic clock. A detection photodiode measures the attenuation of the laser beam after passage through the cell. Electronic circuitry adjusts the electronic oscillator to the frequency of the atomic hyperfine transition based on the photodiode signal which shows a minimum at the target frequency. This minimum is due to coherent population trapping which refers to the fact that a fraction of the atoms become trapped in a coherent superposition of the two ground states forming the hyperfine transition, which does not absorb light due to destructive interference between the transition probability amplitudes of the optical transitions of these ground states to the optical excited state.

D. K. Serkland et al., "VCSELs for Atomic Clocks", http://www.sandia.gov, describe the use of VCSELs (VCSEL: vertical cavity surface emitting laser) for atomic clocks relying on such coherent population trapping. The physical background of this technique is also explained in this document. Serkland et al. use a gas cell filled with Cs which is excited by a VCSEL emitting at a wavelength of 852 nm. The laser output is frequency-modulated at 4.6 GHz, thereby obtaining frequency modulation side bands at +/−4.6 GHz from the carrier optical frequency of 352 THz (852 nm). The power of the laser beam after passage through the gas cell is measured by a photodiode which is arranged on the opposite side of the gas cell. When the modulated VCSEL is tuned to the approximately 1 GHz wide absorption resonance and the modulation frequency is tuned in the vicinity of 4.6 GHz, a narrow increase of the transmitted optical power is observed at exactly half of the 9.2 GHz hyperfine frequency. The local oscillator for generating the 4.6 GHz modulation is locked to this narrow resonance, yielding a frequency which is exactly half of the Cs ground state hyperfine splitting.

OBJECT AND SUMMARY OF THE INVENTION

It is an object of the present invention to provide an atomic frequency acquisition device which can be used as an atomic clock and allows further miniaturization and cost reduction as compared to the systems of the prior art.

The object is achieved with the atomic frequency acquisition device as defined in claim 1. Advantageous embodiments of this device are subject matter of the dependent claims or are described in the subsequent portions of the description.

The proposed atomic frequency acquisition device comprises at least
- a gas cell filled with an atomic gas having first and second energy transitions allowing coherent population trapping, said first and second energy transitions corresponding to first and second transition frequencies;
- a laser light source with a laser cavity emitting a laser beam which enters the gas cell and excites the first energy transition of the atomic gas;
- a local oscillator adapted to generate an oscillator frequency in a frequency range including half of the second transition frequency of the atomic gas;
- a modulator modulating said laser light source so as to emit laser radiation modulated with the oscillator frequency;
- an optical reflector arranged to reflect the laser beam after passage through the atomic gas so as to re-enter the laser cavity, said re-entered laser beam causing a self-mixing effect in the laser cavity, resulting in beat frequencies in an intensity of the emitted laser radiation;
- a photodetector arranged to detect the beat frequencies; and
- a control unit connected to the photodetector and local oscillator and controlling the local oscillator so as to periodically vary the oscillation frequency between two frequency margins, the two frequency margins being adapted in such a way that a maximum beat frequency in an output signal of the photodetector is within the two frequency margins.

The maximum SMI beat frequency is reached exactly when the oscillator is tuned to half of the second transition frequency. Consequently, this maximum beat frequency can be used to lock the oscillator to this transition frequency which is then used as the time base for further applications. This self-mixing interference technique renders it possible to use a VCSEL with an integrated photodiode as the laser and detection device. This makes the opto-mechanical setup more compact because laser and detector are integrated and arranged only on one and the same side of the gas cell. In such a case, the full device or atomic clock consists only of the VCSEL with an integrated photodiode (VIP), a gas cell and an appropriate ASIC forming the local oscillator and the control unit. Consequently, extreme miniaturization and cost reduction become possible. Furthermore, based on the detection principle using self-mixing interference, only frequencies rather than amplitudes are measured. This can be done more easily and with fewer detection problems than in the solutions of the prior art. In this case, the measurement signal may be rather strong, is completely undisturbed by any other radiation not originating from the laser itself and can be measured as a relatively low-frequency signal in the kHz to MHz range, which is preferable as compared to a DC amplitude measurement as described in the prior art.

The detection principle of the proposed device can be understood as follows. The gas cell filled with the atomic gas, which may be, for example, Rb or Cs vapor, is arranged between the laser light source and the optical reflector or mirror giving the feedback. This feedback is very sensitive to the optical length of the feedback path, because any change by a quarter wavelength already causes a change of the feedback signal. While the distance between the optical reflector and the laser light source is kept at a constant geometrical length, the optical length changes if the refractive index in between is changing. The refractive index of a gas depends on the wavelength. Especially close to a resonant transition, the refractive index reaches very high values and changes quickly with the wavelength.

In the proposed setup of the atomic frequency acquisition device, the strength of the optical absorption does not only depend on the wavelength but also on the perfect match of the modulation frequency to half of the second transition frequency, which is half of the HFS (hyper fine splitting) transition in the case of a metallic vapor such as Cs or Rb. If the frequency of the local oscillator deviates a bit from the desired frequency, the refractive index changes and the photodetector measures a signal similar to a change in the distance between the optical reflector and the laser light source. Such a measurement principle is known from SMI sensors (SMI: self-mixing interference) which are based on VCSELs with integrated or attached photodetectors.

In contrast to the common use of such an SMI sensor, its use in an atomic frequency acquisition device makes the detection more difficult than usual because of severe complications. The external distance between the optical reflector and the laser light source is commonly measured via a modulation of the laser current which yields a modulation in laser wavelength. However, the spectral width of the Cs or Rb transitions is so small that the laser has to operate exactly at the right wavelength. This is very difficult to achieve so that this method cannot be applied here. A change in the external distance between the laser and the optical reflector, also referred to as the external optical cavity length, can also be observed as a movement of the optical reflector. However, this movement, which requires a speed measurement, would have to be controlled to an extreme accuracy in order to reach the precision expected from an atomic clock. The clock would show a long-term walk-off even if the oscillator shifts extremely slowly. The applied technique should allow a correct detection of the HFS transition maximum and not only of the changes. This can neither be done via wavelength scanning, nor by means of the movement detection.

In order to avoid the above complications, the control unit of the proposed device is designed to allow the following detection method. The laser light source is running at a constant wavelength, i.e. the wavelength of the first (optical) energy transition of the used atoms, in particular of Rb or Cs. It should be noted that the spectral width of the laser is much smaller than that of the first energy transition. Therefore, a small variation of laser wavelength is still allowed. The laser power is modulated with the frequency of the local oscillator, for example, 4.6 GHz. It has to be ensured that any wavelength change stays small enough. This seems to be granted by the high modulation frequency. Furthermore, the power modulation depth may be limited to a fraction of the absolute power in order to ensure this condition.

The local oscillator is not really running at a fixed frequency but is slowly frequency-modulated, for example, at 4.6 GHz with a frequency change around 20 to 50 kHz. This leads to a stronger and weaker HFS transition and therefore to a change in the optical external cavity length. This change is strongest around the HFS maximum, i.e. around the desired frequency to be acquired.

The SMI beat frequency is highest at the strongest change in the optical external cavity length. Consequently, the maxima for the SMI beat frequency, which is measured, and for the optimum HFS frequency, which is desired, coincide so that the HFS transition frequency is found by looking only for the maximum beat frequency. This measurement is rather unambiguous, because it does not depend on absolute amplitudes. The self-mixing effect causes a variation of the output power of the laser light source in a periodic manner, which is measured by the photodetector. The output signal of the photodetector therefore includes a beat signal, i.e. timely spaced peaks in this output, which is supplied to a frequency detection circuit determining the frequency of the beat signal, i.e. the inverse time between every two peaks. Alternatively, the phase of the beat signal can be measured directly (e.g. by a phase-locked loop circuit), which is advantageous in the case of slow variations.

In one embodiment of the proposed device, the control unit is designed to adjust the modulation frequency range of the oscillator in such a way that the desired HFS frequency is always at the center of the modulation range, i.e. centered between two margin frequencies of this modulation which are continuously adapted. Periods of time in which the oscillator runs at a too high frequency are thus exactly cancelled by periods having a too low frequency. A very good long-term accuracy of the device is achieved with this measure.

It is clear from the foregoing description that the gas cell is not limited to any special design or dimension. This gas cell must only be able to maintain the atomic gas at a desired temperature and/or pressure, which may be achieved by additional heating elements attached to the gas cell. Furthermore, the gas cell must allow the passage of the laser light beam along at least one path. The optical reflector, in particular an appropriate mirror for the wavelength of the laser beam, may be directly attached to, or spaced apart from the gas cell. Furthermore, such a mirror may also be formed inside the gas cell or as a layer of one of the walls of the gas cell. The modulation of the laser output is preferably achieved by modulating an operating current of the laser light source, but is not limited to such a mode of modulation.

BRIEF DESCRIPTION OF THE DRAWINGS

The proposed atomic frequency acquisition device will now be described, by way of example, with reference to the accompanying drawing without limiting the scope of protection as defined by the claims. In the drawing.

DESCRIPTION OF EMBODIMENTS

Figure 1:
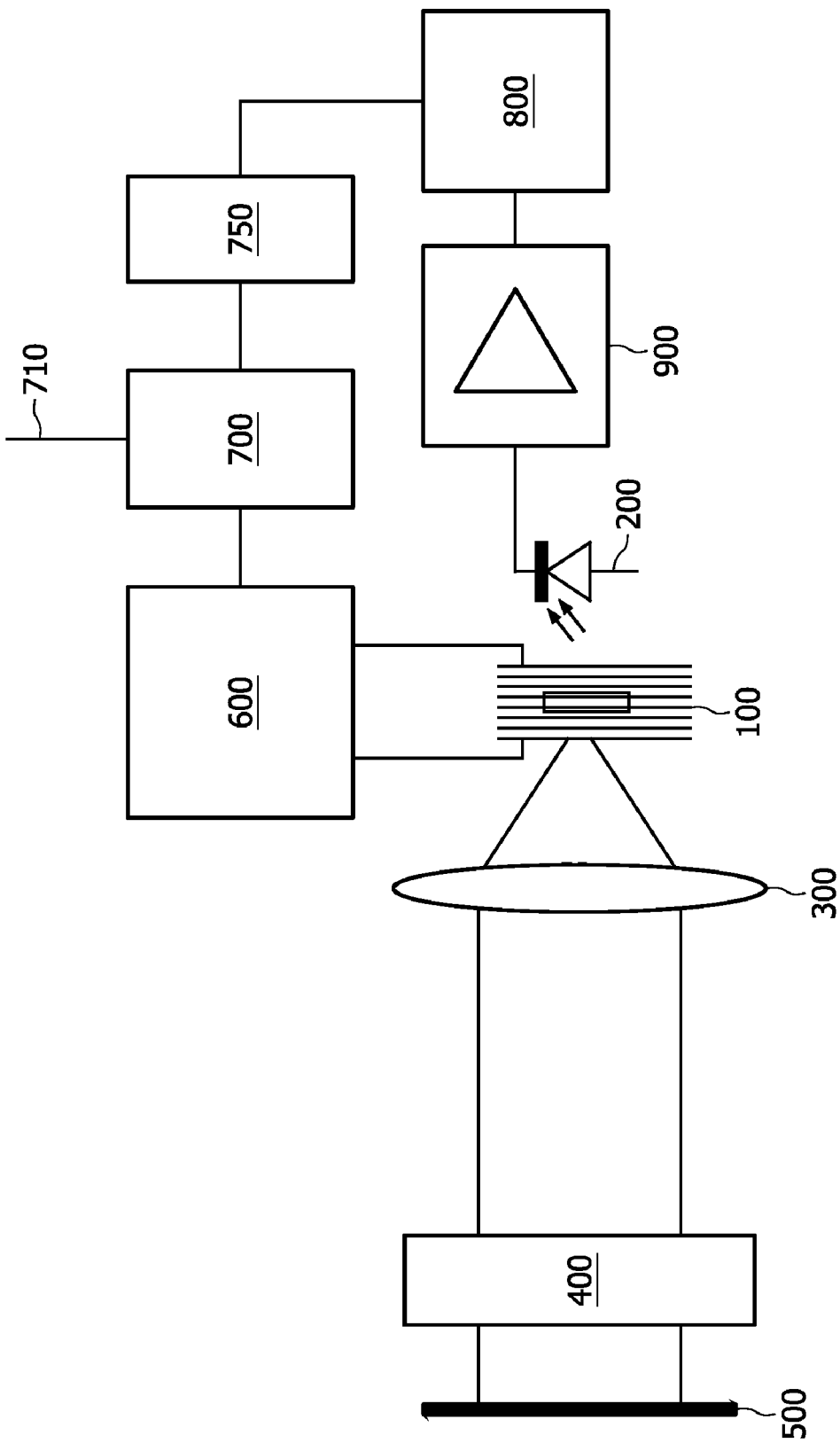
FIG. 1 is a schematic layout of an embodiment of the atomic frequency acquisition device.

FIG. 1 is a schematic layout of an example of the proposed atomic frequency acquisition device or atomic clock. A laser driver 600 supplies an operating current to the VCSEL 100 which emits a laser beam towards the collimation lens 300. The laser beam passes through the gas cell 400 which is kept at an elevated temperature of, for example, between 60° C. and 100° C. so as to maintain a proper pressure of the filled alkali metal, which is Cs in the present example. The temperature can be controlled via small heating elements including a temperature measurement and feedback loop (not shown). Such gas cells are commonly known in the art of atomic clocks.

A mirror 500 is arranged behind the gas cell 400 in order to reflect the collimated laser beam backwards to itself. In order to adjust a desirable feedback, the reflectivity of the mirror 500 should be designed properly, for example, with a reflectivity of 10%. Furthermore, an additional attenuator in front of the laser 100 is also recommended in order to ensure an optimal self-mixing effect inside the laser cavity. All other optical surfaces are preferably provided with an antireflection (AR) coating. The feedback influences the optical power of the laser due to self-mixing. This laser power is monitored by the photodiode 200 which measures the amount of laser radiation leaking through the bottom DBR (DBR: distributed Bragg reflector) at this side of the laser. Preferably, the photodiode 200 is monolithically integrated with the VCSEL as known in the art of VCSELs performing self-mixing interference. The photodiode may also be integrated directly in the bottom DBR.

The electric signal from the photodiode 200 is amplified in the amplifier 900 and analyzed in the spectrum analyzer 800. Based on the analysis, the spectrum analyzer 800 provides the beat frequency caused by the self-mixing interference. This beat frequency is analyzed in the control circuit 750 which also sets the frequency modulation of the local oscillator 700 in such a way that the maximum beat frequency is exactly in the center of the modulation interval. The oscillator 700 generates a high frequency of, for example, 4.6 GHz which matches the HFS transition in the used alkali metal. This frequency is used as the time base for the clock which is supplied to the corresponding applications through the clock port 710. The high frequency is also used to amplitude-modulate the power supply 600 of the laser. The modulation depth has to be designed in order to keep any wavelength modulation of the laser much smaller than the line width of the laser.

Figure 2:
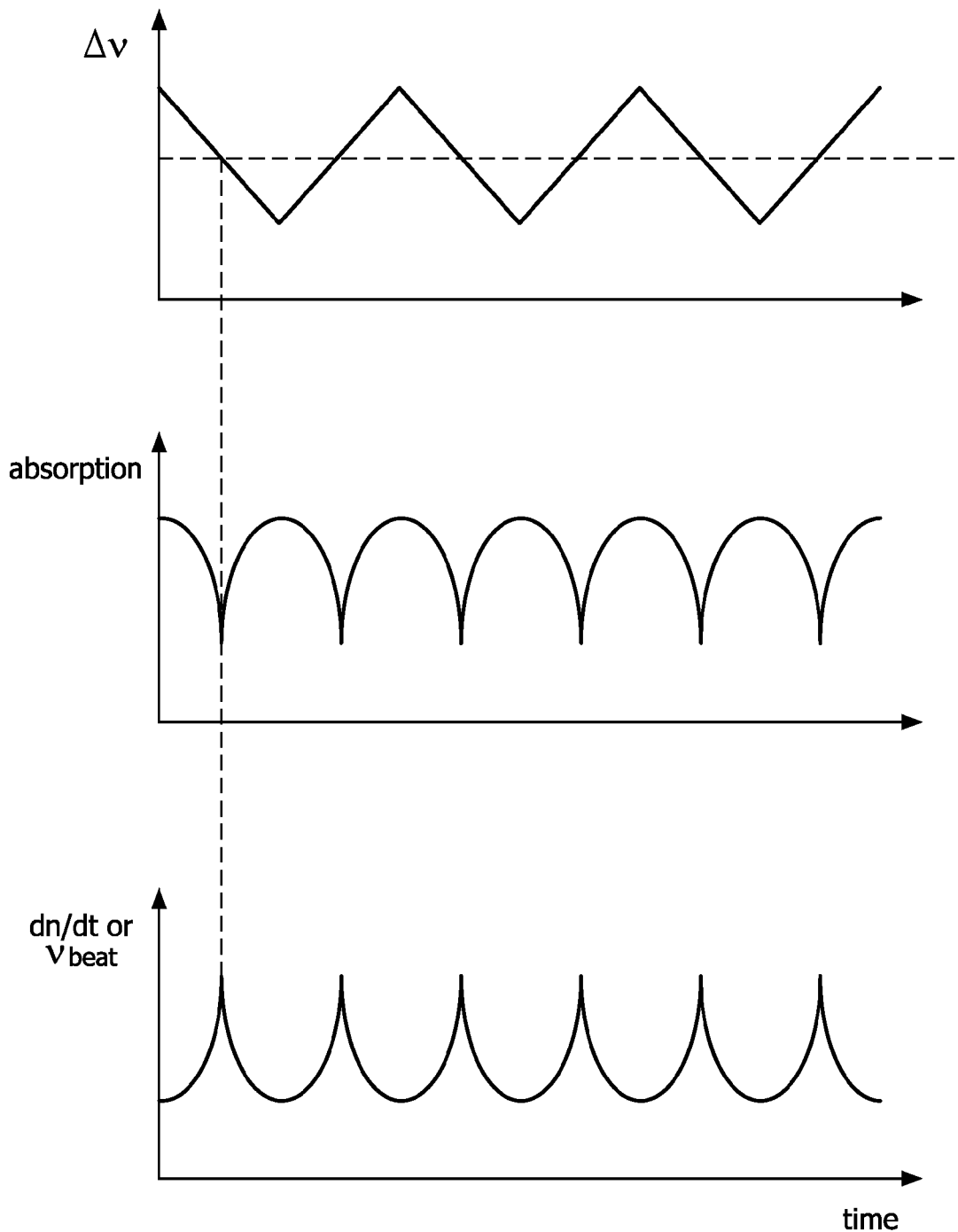
FIG. 2 shows three diagrams illustrating the working principle of the proposed device.

The operation principle is illustrated in FIG. 2. The oscillator 700 is frequency-modulated by the control circuit 750. The top graph in FIG. 2 shows an example of a triangular frequency modulation Δν. The middle graph shows the absorption of the laser beam in the metal vapor. It exhibits a minimum when the oscillator frequency exactly matches the HFS transition. The lower graph shows the change in the refractive index dn/dt, which corresponds to a change in optical external cavity length and therefore to the beat frequency. The maximum beat frequency coincides with the HFS transition.

The horizontal dashed line in the upper graph of FIG. 2 illustrates that the modulation Δν can be chosen in such a way that the areas above and below this line are equal and, consequently, the clock operates too fast and too slow for an equal amount of time. This adjustment, in which the margin frequencies are continuously adjusted, is performed by the control unit 750. With this measure, the desired atomic frequency is always centered in the modulation range of the local oscillator. This centered oscillation frequency, to which the local oscillator is stabilized, is used as the standard signal of an atomic clock.

While the invention has been illustrated and described in detail in the drawings and the foregoing description, such illustrations and description are to be considered illustrative or as examples and are not limiting. The invention is not limited to the disclosed embodiments. The different embodiments described above and defined in the claims can also be combined. Other variations of the disclosed embodiments can be understood and effected by those skilled in the art in practicing the claimed invention, from the study of the drawings, the disclosure and the appended claims. For example, the invention is not limited to the use of the VCSEL. Also a VECSEL (vertical extended cavity surface emitting laser) may be used as a laser light source in the same manner. If miniaturization is not required, also other laser light sources may be used in the device.

In the claims, use of the verb "comprise" and its conjugations does not exclude other elements or steps, and the indefinite article "a" or "an" does not exclude a plurality. The mere fact that measures are recited in mutually different dependent claims does not indicate that a combination of these measures cannot be used to advantage. The reference signs in the claims should not be construed as limiting the scope of these claims.

| LIST OF REFERENCE SIGNS | |
|---|---|
| 100 | VCSEL |
| 200 | photodiode |
| 300 | collimation lens |
| 400 | gas cell |
| 500 | mirror |
| 600 | laser driver |
| 700 | local oscillator |
| 710 | clock port |
| 750 | control circuit |
| 800 | spectrum analyzer |
| 900 | amplifier |

The invention claimed is:

1. An atomic frequency acquisition device comprising:
a gas cell filled with an atomic gas having first and second energy transitions allowing coherent population trapping, said first and second energy transitions corresponding to first and second transition frequencies;
a laser light source with a laser cavity emitting a laser beam which enters the gas cell and excites the first energy transition of the atomic gas;
a local oscillator adapted to generate an oscillator frequency in a frequency range including half of the second transition frequency of the atomic gas;
a modulator modulating said laser light source so as to emit laser radiation modulated with the oscillator frequency;
an optical reflector arranged to reflect the laser beam after passage through the atomic gas so as to re-enter the laser cavity, said re-entered laser beam causing a self-mixing effect in the laser cavity, resulting in beat frequencies in an intensity of the emitted laser radiation;
a photodetector arranged to provide an output signal comprising said beat frequencies; and
a control unit connected to the photodetector and the local oscillator and controlling the local oscillator so as to periodically vary the oscillation frequency between two frequency margins based on the beat frequencies, the two frequency margins being adapted in such a way that a maximum beat frequency in the output signal of the photodetector is within the two frequency margins.

2. The device according to claim 1, wherein the control unit is configured to adapt the two frequency margins in such a way that the maximum beat frequency in the output signal of said photodetector is centered between the two frequency margins.

3. The device according to claim 1, wherein the control unit is configured to periodically vary the oscillation frequency with a modulation frequency of between 1 kHz and 100 kHz.

4. The device according to claim 1, wherein said laser light source is a VCSEL.

5. The device according to claim 4, wherein said photodetector is monolithically integrated with said VCSEL.

6. The device according to claim 5, wherein said modulator is designed to modulate an operating current of said laser light source.

7. The device according to claim 1, wherein the control unit comprises a control circuit for controlling the local oscillator and a spectrum analyzer for determining the beat frequencies in the output signal of said photodetector.

8. An atomic frequency acquisition device, comprising:
- a cell filled with an atomic gas having first and second energy transitions allowing coherent population trapping, the first and second energy transitions respectively corresponding to first and second transition frequencies;
- a local oscillator configured to generate an oscillator frequency in a frequency range including half of the second transition frequency of the atomic gas;
- a laser source configured to direct a laser output into the cell, the laser output having a wavelength approximately corresponding to the first energy transition of the atomic gas and being modulated with the oscillator frequency;
- an optical reflector configured to reflect the laser output from the cell to the laser source, the reflected laser output causing a self-mixing effect;
- a photodetector configured to output a beat signal corresponding to variations in output power of the laser source, caused by the self-mixing effect, the beat signal having a beat frequency; and
- a feedback circuit configured to determine a maximum beat frequency of the beat signal, and to adjust the oscillator frequency generated by the local oscillator to half of the second transition frequency using the maximum beat frequency, wherein the maximum beat frequency corresponds to half of the second transition frequency.

9. The device according to claim 8, wherein the laser source comprises a vertical cavity surface emitting laser (VCSEL), and the detector comprises a photodiode monolithically integrated with the VCSEL.

10. The device according to claim 8, wherein the second energy transition comprises a hyper fine splitting (HFS) transition in the atomic gas.

11. The device according to claim 8, wherein a distance between the optical reflector and the laser source remains a constant geometrical length.

12. The device according to claim 8, wherein the atomic gas comprise one of Cesium (Cs) or Rubidium (Rb).

13. The device according to claim 8, wherein the optical reflector has a reflectivity of about 10 percent.

14. The device according to claim 8, wherein the feedback circuit comprises:
- a spectrum analyzer for providing the beat frequency; and
- a control circuit for setting the oscillator frequency generated by the local oscillator in response to the maximum beat frequency.

* * * * *